(12) United States Patent
Kresge et al.

(10) Patent No.: US 6,562,654 B2
(45) Date of Patent: May 13, 2003

(54) TENTED PLATED THROUGH-HOLES AND METHOD FOR FABRICATION THEREOF

(75) Inventors: John S. Kresge, Binghamton, NY (US); David B. Stone, Jericho, VT (US); James R. Wilcox, Vestal, NY (US)

(73) Assignee: International Business Machines Corporation, Armonk, NY (US)

( * ) Notice: Subject to any disclaimer, the term of this patent is extended or adjusted under 35 U.S.C. 154(b) by 152 days.

(21) Appl. No.: 09/829,469

(22) Filed: Apr. 9, 2001

(65) Prior Publication Data

US 2001/0022392 A1 Sep. 20, 2001

Related U.S. Application Data

(62) Division of application No. 09/416,284, filed on Oct. 12, 1999, now Pat. No. 6,249,045.

(51) Int. Cl.[7] .......................... H01L 21/44; H01L 21/48
(52) U.S. Cl. ...................... 438/106; 438/107; 438/108; 438/612; 438/666
(58) Field of Search .................. 257/678; 438/666, 438/677, 686, 106, 107, 108, 612; 174/255, 265; 430/311, 312, 314

(56) References Cited

U.S. PATENT DOCUMENTS

| 3,469,982 A | 9/1969 | Celeste ....................... 96/35.1 |
| 5,443,672 A | 8/1995 | Stoll et al. ............. 156/244.17 |
| 5,618,636 A | 4/1997 | Watanabe et al. ........... 428/626 |
| 5,633,206 A | 5/1997 | Kim et al. .................... 29/827 |
| 6,009,620 A | * 1/2000 | Bhatt et al. |
| 6,013,417 A | * 1/2000 | Sebesta et al. .............. 430/312 |

OTHER PUBLICATIONS

Fink, Peter, Designrules SPT MCM–L Technologie Handbook, STP Abteilung 6590, Version 1.0, Jan. 20, 1996, Jan. 12, 1995.

* cited by examiner

*Primary Examiner*—Olik Chaudhuri
*Assistant Examiner*—Hsien-Ming Lee
(74) *Attorney, Agent, or Firm*—William N. Hogg

(57) ABSTRACT

A process for tenting through-holes comprises providing a circuitized substrate having a plurality of plated through-holes, wherein the plated through-holes are tented with a polyimide material.

13 Claims, 1 Drawing Sheet

U.S. Patent
May 13, 2003
US 6,562,654 B2
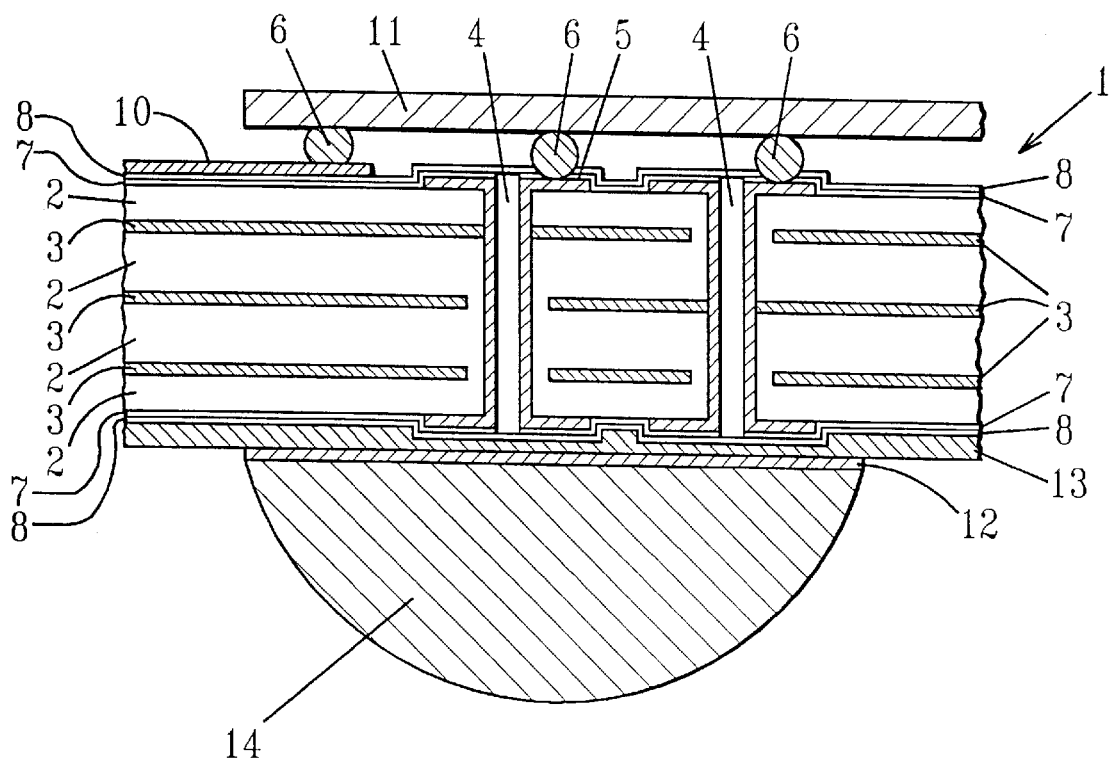

TENTED PLATED THROUGH-HOLES AND METHOD FOR FABRICATION THEREOF

CROSS REFERENCE TO COPENDING APPLICATION

This application is a divisional application of Ser. No. 09/416,284, filed Oct. 12, 1999 now U.S. Pat. No. 6,249,045.

TECHNICAL FIELD

The present invention is concerned with a circuitized substrate having plated through-holes wherein plated through-holes are tented with a dielectric polymer film. Tenting of plated through-holes makes it possible to use the real estate above the tented plated through-holes for wiring and/or bonding pads. In addition, the present invention is concerned with a method for tenting plated though-holes with a dielectric polymeric film.

BACKGROUND OF INVENTION

Increasing levels of integration of integrated circuit chips reduces the chip count of a functional circuit, while significantly increasing the I/O count of the individual integrated circuits making up the functional circuit. This drive for increased circuit and component density in the individual integrated circuit chips leads to a parallel drive for increased circuit and component density in the printed circuit boards carrying the chips and in the assemblies using them.

Many applications in electronic packaging including laminate chip carriers are being constrained in their ability to escape the desired number of I/O. These constraints include line widths, line spaces, plated through-hole diameters and plated through-hole capture pad diameters. Plated through-holes are typically limited in their size by the ability of small drills, and the inability to plate holes of high aspect ratios (hole length/divided by hole diameter). Line widths/spaces are typically limited by photo lithographic constraints including the tendency for yields to decrease with decreased line widths.

The increase circuit and component density in the printed circuit boards makes the ability to locate either solder surface mount components or place additional circuitry layers directly above plated through-holes highly desirable. This is especially the case when the density of the plated through-holes required to service the I/O's of the surface mount components is such that there is no surface area available for attachment pads interstitial to the plated through-hole grid.

This problem is especially severe with fine pitch ball grid array components (BGA) and flip chip attach (FCA) integrated circuits.

It would therefore be desirable to provide for the tenting of plated through-holes by a dielectric layer.

SUMMARY OF INVENTION

The present invention provides for the tenting of plated through-holes which in turn allows using the real estate above the plated through-hole for wiring and/or bonding pads. This is especially advantageous when it is desired to feed power through plated through-holes directly beneath the chip and have a full grid BGA package. Since the area of 1 BGA pad is large compared to the array of power and ground C4s, a dielectric layer is required to isolate BGA pads from the plated through-holes under the chip. Of course, outside the chip footprint, the locations of plated through-holes can be chosen to avoid this concern.

According to the present invention, plated through-holes are tented with a layer of dielectric thermosettable polyimide composition. The use of the thermosettable polyimide makes it possible to employ relatively thin films along with the ability to withstand the relatively high temperatures used for a subsequent C4 chip attachment.

In addition, the present invention is concerned with a process for tenting plated through-holes with a polymer film which comprises the steps of:

providing a circuitized substrate having plated through-holes;

applying a first layer of a thermoplastic polyimide material onto a surface of the circuitized substrate;

providing a new layer of a sacrificial carrier material;

applying and partially curing a second layer of polyimide material on a surface of the sacrificial carrier material;

bringing the first layer of polyimide material into contact with the second layer of polyimide material and laminating to thereby bond together the first and second layers of polyimide material;

removing the layer of the sacrificial carrier material;

and curing the thermosettable polyimide material.

Still other objects and advantages of the present invention will become readily apparent by those skilled in the art from the following detailed description, wherein it is shown and described only the preferred embodiments of the invention, simply by way of illustration of the best mode contemplated of carrying out the invention. As will be realized the invention is capable of other and different embodiments, and its several details are capable of modifications in various obvious respects, without departing from the invention. Accordingly, the description is to be regarded as illustrative in nature and not as restrictive.

SUMMARY OF DRAWING

The FIGURE is a schematic illustration of a portion of a structure that can be fabricated in accordance with the present invention.

BEST AND VARIOUS MODES FOR CARRYING OUT INVENTION

In order to facilitate an understanding of the present invention, reference will be made to the FIGURE.

In particular, the FIGURE illustrates employing the tented through-holes according to the present invention in a structure for connecting an array of power and ground C4s to a ball grid array pad.

More particularly, numeral 1 represents a subcomposite that contains dielectric layers 2 which can be fiber reinforced composites such as a polyfluorocarbon resin reinforced with fiberglass. The subcomposite 1 also include conductive internal planes 3 which can be referred to as power planes. Plated through-holes 4 are also provided. The plated through-holes include lands 5 to provide for subsequent contact with solder balls 6.

A thermoplastic polyimide layer 7 is coated onto a surface of the subcomposite. If desired, the polyimide 7 can be coated onto both of the external planes of the subcomposite. The polyimide precursor is preferably sprayed onto the substrate and can be dried by heating at temperatures of about 240 to about 260° C. The thickness of the polyimide precursor layer 7 is about 4 to about 12 microns, and more typically about 6 to about 7 microns. In view of its thickness and flowability such will not tent over the through-holes nor plug up the through-holes.

In addition, a thermoset polyimide precursor 8 is coated such as by spraying onto a sacrificial carrier (not shown) and is partially cured to the B-stage by heating at temperatures of about to 240 to about 260° C. The thickness of the thermoset polyimide precursor layer 8 on the sacrificial carrier is about 4 to about 12 microns.

The sacrificial carrier layer is typically stainless steel or aluminum.

The polyimide precursors (polyamic acids for both the thermoplastic and thermoset polyimides) that can be employed in accordance with the present invention include unmodified polyimide precursors such a precursors of polyester imides, polyimide-amide-esters, polyimide-amides, polysiloxane-imides, as well as other mixed polyimide. Such are well known in the art and need not be described herein in any great detail.

Polyamic acids are commercially available such as from DuPont under the trade designation "Pyralin" and Asahi Corp. under the trade designation Pimel 6240. Such polyimide precursors come in many grades including those available Pyralin polyimide precursors from DuPont under the further trade designations PI-2555, PI-2566, PI-2545, PI-2560, PI-5878, PIH-61454 and PI-2540. These particular Pyralin materials are all pyromelletic dianhydride-oxydianaline (PMDA-ODA) polyimide precursors.

Generally, the polyamic acids include the following recurring unit:

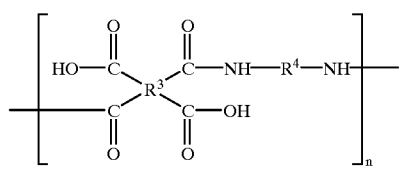

where n is an integer representing the number of repeating units to provide a molecular weight usually about 10,000 to about 100,000. $R_3$ is at least one tetravalent organic radical selected from the group consisting of:

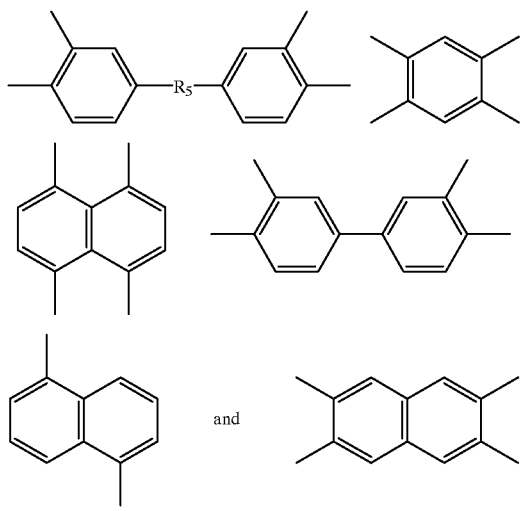

$R_5$ being selected from the group consisting of divalent aliphatic hydrocarbon radicals having from 1 to 4 carbon atoms and carbonyl, oxy, sulfo, hexafluoroisopropylidene and sulfonyl radicals and in which $R_4$ is at least one divalent radical selected from the group consisting of:

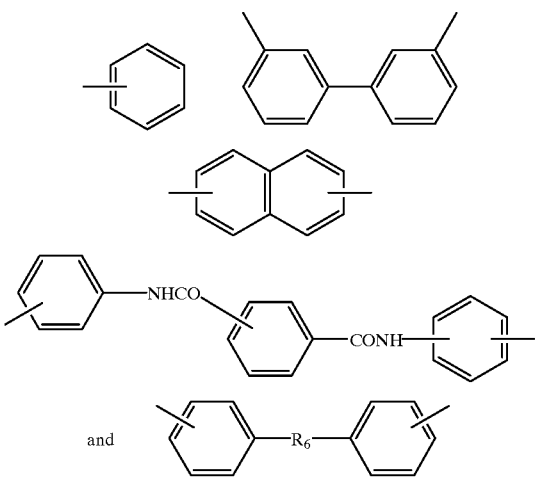

in which $R_6$ is a divalent organic radical selected from the group consisting of $R_2$, silicon, and amino radicals. Polymers containing two or more of the R and/or $R_1$ radicals, especially multiple series of $R_1$ containing amido radicals, can be used.

Typical polyimide precursors are the precursors of polyamide-imide-esters, such as Pimel 6240, which is a polyamide-imide-acrylate ester. More particularly, Pimel 6240 is a benzophenone tetracarboxylic dianhydride/methylene diamine/metaphenylene diamine hydroxyethyl methacrylate ester.

The preferred thermoplastic polyimide employed is PI-2566 and the preferred thermoset polyimide employed is PI-5878.

Optionally, after partially curing the polyimide layer 8 to what is referred to as the "B-stage", such be subjected to a caustic etch in order to activate the surfaces for enhanced adhesion. However, this is not essential according to the present invention.

In any event, the two layers of polyimide 7 and 8 are brought into contact with each other and are then laminated in order to bind the layers 7 and 8 of polyimide materials together. The lamination is typically carried out at pressures of about 800 to about 1200 psi and more typically at about 1000 to about 1100 psi, a particular example being about 1000 psi. The temperature of the lamination is typically about 300 to about 350° C., and more typically about 310 to about 320° C.

The maximum thickness of the combined polyimide layers 7 and 8 is about 6 to about 12 microns thick above the external copper lands. The term "external copper" refers to that which is external to the substrate layer and is identified as 5 in the FIGURE.

Next, the sacrificial carrier is removed such as by etching using a composition comprising ferric chloride and HCl for stainless steel or HCl for aluminum.

The top surface of the structure can then be blanket coated with a conductive layer such as copper followed by defining circuitized conductor features 10.

The polyimide layers can be cured and then selectively removed by laser etching to provide access to the copper layers on the vias, which in turn provide electrical contact to internal conductive planes in the dielectric substrate.

As shown, the solder balls 6 can then be provided and connected to both the plated through holes at one level 5 and the circuitry 10 at a second level. Typically, height or thickness between the top of the lower level 5 and the top of upper level 10 (referred to as a "step") is about 20 microns or less and more typically about 10 microns or less. The thickness of the thermoset polyimide and layer 10 are selected to provide the desired thickness.

The circuit chip 11 can then be connected to the substrate via the solder balls 6. As can be appreciated, the present invention makes it possible to provide a structure having chip connection at different levels along with having plated through holes.

In addition, the BGA pad 12 can be defined within conductive mounting plane 13 attached to the polyimide layer 7, 8. This polyimide layer 7, 8 provides the necessary insulation between the plated through-holes and the BGA pad. Conductive BGA interconnect structure 14 is attached to BGA pad 12.

As apparent from the above, using the relatively thin dielectric layers, the bonding sites can be provided on both the of external planes of the subcomposite without requiring a plated via and without utilizing valuable space for a capture pad and dog bone for the via on the external layer. As shown, this is every effective for bringing power up directly beneath the chip, using a dog bone plated through-hole without sacrificing wireability on the external layer. In addition, the polyimides are capable of withstanding the relatively high temperatures used for the C4 processing. Furthermore, the process of the present invention is relatively easy to carry out.

The foregoing description of the invention illustrates and describes the present invention. Additionally, the disclosure shows and describes only the preferred embodiments of the invention but, as mentioned above, it is to be understood that the invention is capable of use in various other combinations, modifications, and environments and is capable of changes or modifications within the scope of the inventive concept as expressed herein, commensurate with the above teachings and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. A process for tenting plated through holes comprising the steps of:
   providing a circuitized substrate including a plurality of through holes therein, each of said through holes defined by at least one side wall within said circuitized substrate, said circuitized substrate having a first and second surface;
   applying a first layer of polyimide material onto said first surface of said circuitized substrate;
   providing a layer of a sacrificial carrier material;
   applying and partially curing a second layer of polyimide material on a surface of said sacrificial carrier material;
   bringing said first layer of polyimide material into contact with said second layer of polyimide material and laminating said first and second layers together;
   removing said layer of said sacrificial carrier material; and
   curing said second layer of polyimide material.

2. The process of claim 1 further including a step of plating a layer of conductive material on said at least one side wall of each of said plurality of through holes.

3. The process of claim 2 further including a step of forming a layer of conductive circuit lines on a portion of said second layer of polyimide material.

4. The process of claim 3 further including the steps of:
   providing a plurality of solder balls electrically connected to said layer of conductive circuit lines on said portion of said second layer of polyimide material and electrically connected to said layer of conductive material on said at least one side wall of selected ones of said plated through holes in said circuitized substrate; and
   positioning an integrated circuit chip in electrical contact with said plurality of solder balls.

5. The process of claim 1 wherein said step of applying said first layer of polyimide material onto said first surface of said circuitized substrate further comprises positioning a third layer of polyimide material on said second surface of said circuitized substrate.

6. The process of claim 5 further including a step of providing a ball grid array pad on said third layer of polyimide material.

7. The process of claim 1 wherein said step of providing said layer of sacrificial carrier material comprises a step of providing a layer of aluminum or stainless steel.

8. The process of claim 1 wherein said step of laminating said first and second layers together is performed at a pressure of about 800 to about 1200 psi and at a temperature of about 300 to about 350° C.

9. The process of claim 1 wherein said step of removing said layer of said sacrificial carrier material comprises a step of removing said layer of sacrificial carrier material by etching.

10. The process of claim 9 wherein said step of removing said layer of sacrificial carrier material by etching comprises a step of removing said layer of sacrificial carrier material with a ferric chloride etch composition.

11. The process of claim 1 wherein said step of curing said second layer of polyimide material is performed using actinic light.

12. The process of claim 11 wherein said step of curing said second layer of polyimide material using actinic light is performed with infrared radiation.

13. The process of claim 1 further including a step of selectively removing portions of said first and second layers of polyimide material by laser imaging.

* * * * *